(12) United States Patent
Ludwig et al.

(10) Patent No.: US 7,439,698 B2
(45) Date of Patent: Oct. 21, 2008

(54) ELECTRIC MOTOR SYSTEM

(75) Inventors: Michael Ludwig, Sinsheim (DE); Oliver Lamparth, Maxzell (DE); Arno Kutzki, Keltern (DE); Matthias Rupprecht, Straubenhardt (DE)

(73) Assignee: Harman International Industries, Incorporated, Northridge, CA (US)

( * ) Notice: Subject to any disclaimer, the term of this patent is extended or adjusted under 35 U.S.C. 154(b) by 346 days.

(21) Appl. No.: 11/338,428

(22) Filed: Jan. 23, 2006

(65) Prior Publication Data

US 2008/0030161 A1 Feb. 7, 2008

(30) Foreign Application Priority Data

Jan. 21, 2005 (EP) .................................. 05001250

(51) Int. Cl.
*H02K 17/32* (2006.01)
*H02K 23/68* (2006.01)
*H02K 27/30* (2006.01)
*H02P 7/00* (2006.01)

(52) U.S. Cl. .................... 318/434; 318/286; 318/468

(58) Field of Classification Search ................ 318/138, 318/254, 439, 720–724
See application file for complete search history.

(56) References Cited

U.S. PATENT DOCUMENTS

| 4,320,331 | A | * | 3/1982 | Plunkett | ..................... 318/722 |
| 5,492,458 | A | | 2/1996 | Horng | |
| 6,094,022 | A | * | 7/2000 | Schillaci et al. | ........ 318/400.35 |
| 6,359,408 | B1 | * | 3/2002 | Tyckowski | .................. 318/469 |
| 6,441,531 | B1 | | 8/2002 | Horng et al. | |
| 6,801,011 | B2 | * | 10/2004 | Ide | .............................. 318/700 |
| 2004/0124831 | A1 | | 7/2004 | Micke et al. | |
| 2006/0197480 | A1 | * | 9/2006 | Mori et al. | .................. 318/254 |

FOREIGN PATENT DOCUMENTS

JP 20040472909 3/2004

* cited by examiner

*Primary Examiner*—Lincoln Donovan
*Assistant Examiner*—Thai T Dinh
(74) *Attorney, Agent, or Firm*—The Eclipse Group LLP

(57) ABSTRACT

An electric motor system having a rotor with a plurality of permanent magnets, and a stator having a winding through which current is flowing for driving the rotor. A control unit controls the current flowing through the winding. The control unit employs a first filter and a second filter, each filter is connected to the winding and has outputs coupled to a comparator. The comparator compares the signal output of the first filter to the signal output of the second filter. The control unit controls the current flowing through the winding depending on the result of the comparison of the two filtered signals.

16 Claims, 6 Drawing Sheets

ELECTRIC MOTOR SYSTEM

CROSS-REFERENCE TO RELATED APPLICATION(S)

This application claims priority of European Patent Application Serial No. 05 001 250.9, filed on Jan. 21, 2005, titled ELECTRIC MOTOR SYSTEM; which is incorporated by reference in this application in its entirety.

FIELD OF THE INVENTION

This invention relates generally to electric motors and more particularly to electric motors used in ventilation system for cooling electronic components.

BACKGROUND

Electric motors are widely used to drive fans in ventilation systems. Typically, such motors are alternating current (AC) motors having a rotor, a stator, and permanent magnets angularly displaced around the rotor. The stator has windings carrying current and positioned to intercept the magnetic field of said permanent magnets during rotation of the motor. Terminals are attached to the electric motor in order to supply the windings with an alternating voltage for energizing the winding and determining the speed of rotation of the rotor.

Ventilations systems are increasingly used in electronic multimedia systems, which are often incorporated into a dashboard of a vehicle. These electronic systems typically include different electronic modules, such as, a radio module, an audio module, a telecommunication module, and/or a navigation module. All of these different modules are often mounted in a limited space behind the dashboard, so that these modules operate while positioned close to one another. These electronic modules tend to generate heat, which can adversely affect their operation. As a consequence, the ventilation systems are added in order to cool the different electronic modules.

As noted above, the space in the electronic systems is limited. In addition, electric motors typically require a winding for driving the motor and a winding for detecting the relative position of the magnetic poles relative to pole pieces provided next to the winding. Each winding takes space and requires a pair of terminals, thus further crowding and adding to the cost of manufacturing the system. Accordingly, a need exists for a ventilation system that may be efficiently used in electronic systems having limited space.

SUMMARY

Systems consistent with the invention provide an electronic motor system having a rotor with a plurality of permanent magnets, and a stator having a winding through which current is flowing for driving the rotor. A control unit controls the current flowing through the winding. The control unit employs a first filter and a second filter, each filter is connected to the winding and has outputs coupled to a comparator. The comparator compares the signal output of the first filter to the signal output of the second filter. The control unit controls the current flowing through the winding depending on the result of the comparison of the two filtered signals.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
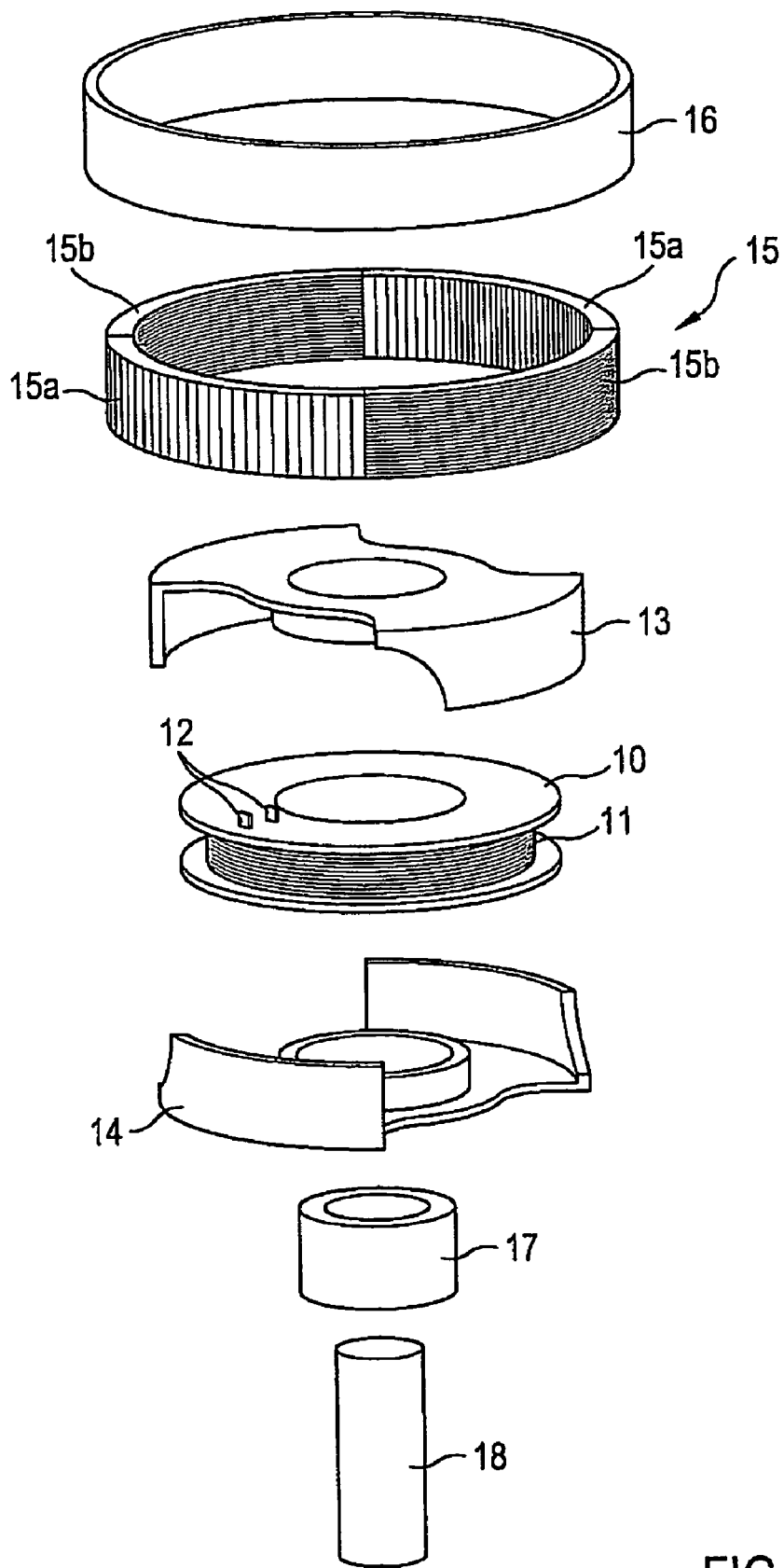
FIG. 1 is a schematic illustrating an exploded view of a claw pole motor that can be used in the motor control system of the invention.

FIG. 1 is a schematic illustrating an exploded view of a claw pole motor. The motor includes a stator 10 having one winding 11 wound around the stator 10. Two terminals 12 are provided on the stator 10 for supplying an alternating voltage and an alternating current to the winding 11. The motor also has an upper claw 13 and a lower claw 14. When a current is flowing through the winding 11, a magnetic field is generated. The magnetic field has a first pole on the side of the first claw 13 and another pole on the side of the other claw 14. The claws 13 and 14, which are made of a magnetic material, concentrate and reinforce the magnetic field in the upper and lower part of the stator 10.

The motor in FIG. 1 also includes a rotor 15 composed of four (or two pairs of) different permanent magnets 15a and 15b, respectively. It should be understood that any other number of permanent magnets could be used. The number of poles will typically depend on the area of application of the motor. On the outer side of the rotor 15, a metallic ring 16 may be provided to the ventilation system to which paddles (not shown) or the like may be connected. Additionally, a sliding bearing 17 and a shaft 18 are provided. The functioning of a claw pole motor is well-known in the art, so that a detailed description of the different components is omitted. According to one implementation of the invention, only one winding 11 is needed in this motor. A second winding for determining the position of the rotor 15 and the permanent magnets relative to the winding 11 and its claws 13 and 14 is not necessary. As a matter of course, the invention is not limited to electric claw pole motors, but can be used in connection with other electric motors.

Figure 2:
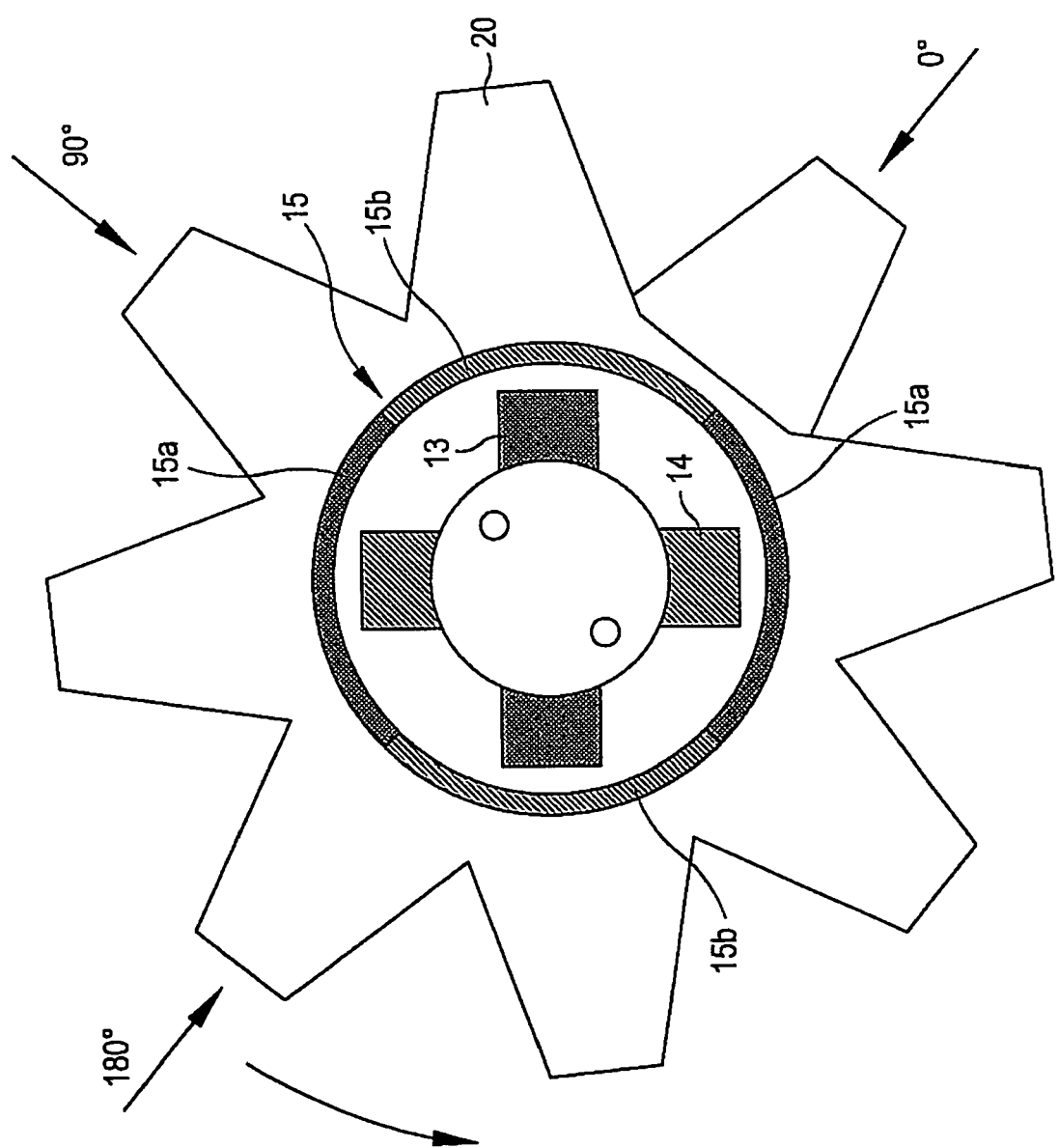
FIG. 2 is a schematic showing a top view of a claw pole motor.

FIG. 2 is a top view of a part of an electric motor ventilation system. Paddles 20 are provided to form a fan on the outer part of the rotor 15, which also includes the magnets 15a and 15b of different polarity. As shown in FIG. 2, the current flows through the winding 11 in a direction that results in the upper claw 13 having the same polarity as the first pair of magnets 15a and a different polarity than the second pair of magnets 15b. As a consequence, the lower claw 14 has the same polarity as the magnets 15b. As the rotor 15 turns, the paddles 20 turn and provide ventilation to the motor's surroundings thereby having a cooling effect on its surroundings.

Figure 3:
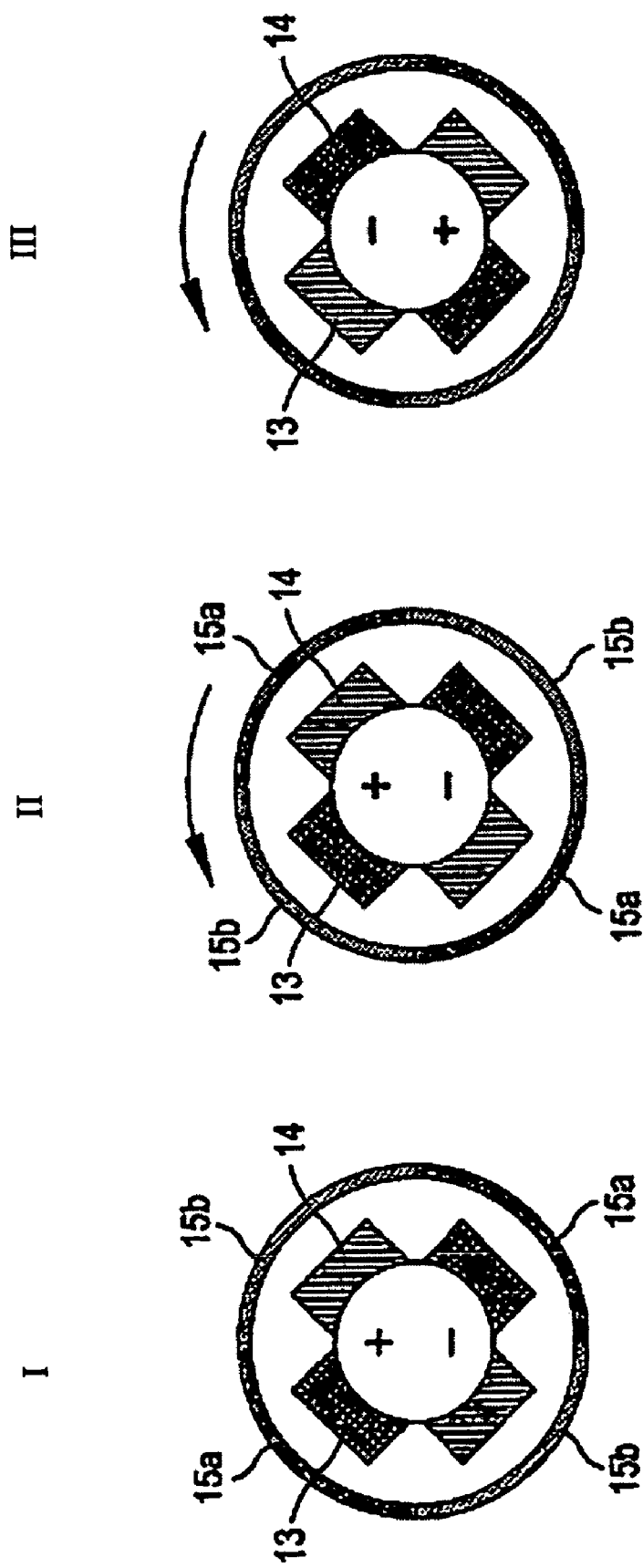
FIG. 3 illustrates different positions of a claw pole motor and the current direction explaining the functioning of the motor.

The functioning of a claw pole motor is described below with reference to FIGS. 2 and 3. FIG. 3 depicts the operation of the claw pole motor of FIG. 2 by illustrating the relative position of the rotor 15 and the magnets 15a and 15b in terms of the direction of the current and the polarity of the claws 13 and 14. In FIG. 3, three positions I, II, III are illustrated. In I, the direction of the current is such that the polarity of the claw 13 is the same as the polarity of the permanent magnet 15a facing the claw 13. Due to the repulsive force of the magnets, the rotor 15 will start to turn in the direction as indicated by the arrow in II. The rotation will stop when the rotor has performed a 90 degree turn, as can be seen in FIG. 2. When the direction of the current in the winding is changed (as indicated by the changed signs + and −), the polarity of the claws 13 and 14 changes as shown in III. The rotor 15 will then again turn by 90 degrees in the direction as indicated by the arrow. As can be seen by FIGS. 2 and 3, each change of the direction of the current flowing through the winding will induce a 90 degree rotation of the rotor 15.

Figure 4:
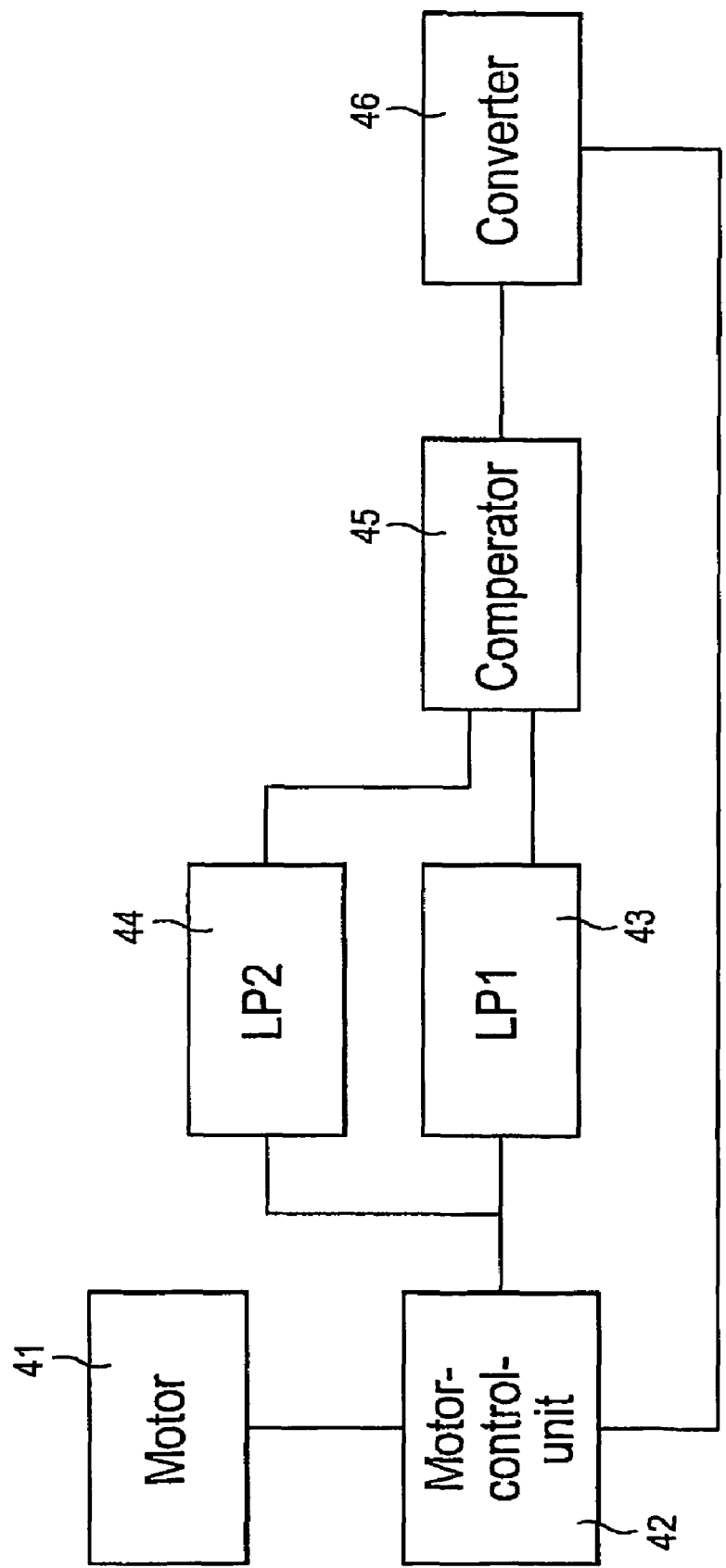
FIG. 4 is a block diagram of a motor control system that can be used for controlling the motor.

FIG. 4 is a block diagram of an example of an electronic motor system. The system includes an electric motor 41, preferably a brushless motor such as a claw pole motor as described in connection with FIGS. 1 to 3. The motor may use only one winding 11 for driving the rotor 15 and for determining the position of the rotor 15 relative to the stator. It should be understood that the motor 41 may use additional windings 11, however, these windings are not necessary for controlling the motor 41. The system in FIG. 4 includes a motor control unit (such as, for example, a H-Bridge) 42 to control the motor 41. The control unit 42 may include a starter unit (not shown) for starting the motor 41. The starter unit provides a clock signal for changing the direction of the currents through the winding and, therefore, for changing the commutating frequency of the rotor 15. The starter unit may be used until the rotor 15 has reached a predetermined rotational speed. The predetermined rotational speed may depend on the condition of use of the motor 41 itself. For example, the rotational speed may be around 90 Hz. When this rotational commutating frequency is reached, the motor 41 is controlled as discussed below. The motor control unit 42 can also stop the motor 41 by turning the current off. The duty cycle may be changed to vary or change the motor speed.

An alternating voltage signal is supplied to the two connecting terminals (not shown) of the winding 11 causing an alternating current to flow through the winding 11. The voltage signal at the two terminals is sensed and coupled to a first low pass filter 43 having a first cut-off frequency $f_1$. Additionally, the same signal is coupled to a second low pass filter 44 having a second cut-off frequency $f_2$ that is higher than the first cut-off frequency. The first and second low pass filters 43 and 44 are used in the control of the motor 41 as discussed in more detail below with reference to FIGS. 4-6.

The change of the current due to the change of the magnetic flux induced determines the point of time at which the direction of current has to be changed in the winding 11. The first cut-off frequency $f_1$ and the second cut-off frequency $f_2$ may be selected in such a way that the second cut-off frequency $f_2$ is around ten to twenty times larger than the first cut-off frequency $f_1$. By way of example, the cut-off frequency $f_1$ of the first low pass filter may be between 10 and 20 Hz, the cut-off frequency $f_2$ of the second low pass filter may be between 150 and 250 Hz. The characteristics of the low pass filters 43 and 44 are selected in such a way that the existing possible frequency components in the output signal of the first low pass filter 43 are much more attenuated than the signals filtered by the second low pass filter 44. The two filtered signals output from the filters 43 and 44 are coupled to a comparator 45. The output of the comparator 45 indicates a comparison of the signals output from the filters 43 and 44. The result of the comparison is then coupled to a converter 46 that generates the converting signal so that the motor control unit 42 will change the direction of the current flowing through the winding 11 accordingly.

Figure 6:
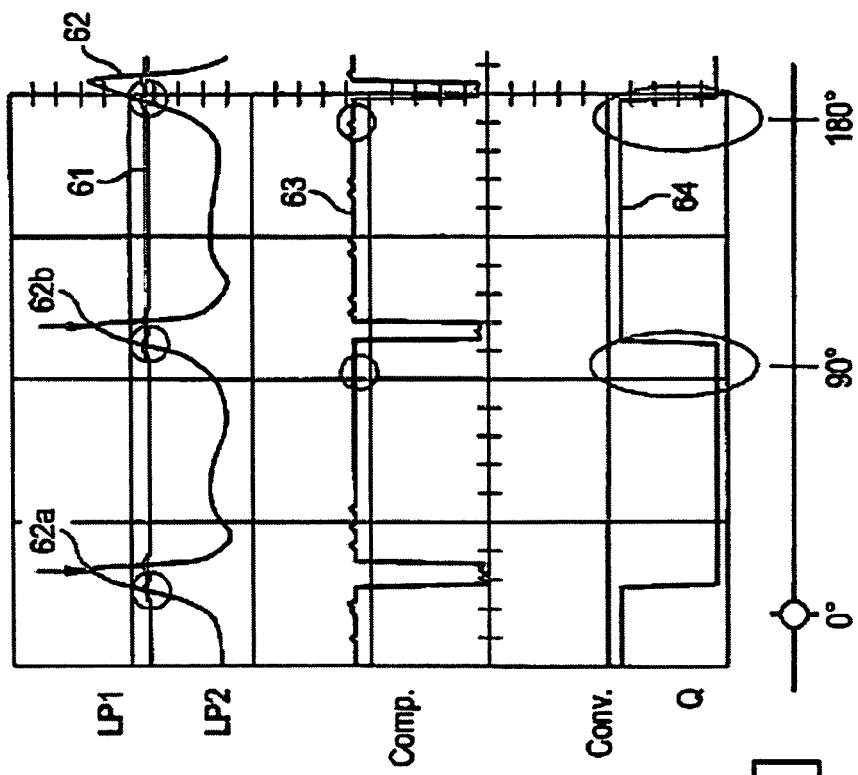
FIG. 6 a signal diagram of the different components of the system shown in FIG. 5.
Figure 5:
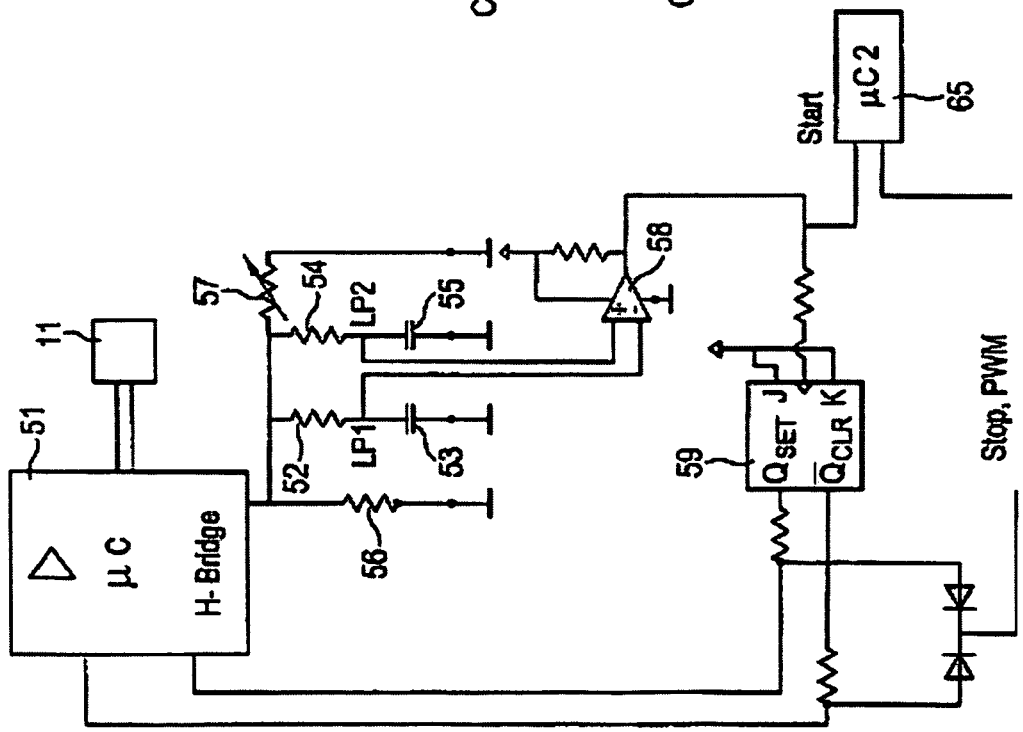
FIG. 5 is a circuit diagram of the motor control system.

FIG. 5 is a circuit diagram depicting in more detail an example of the system shown in FIG. 4. FIG. 6 is a set of signal diagrams showing the signals of the different components in FIG. 5 over a period of time. The circuit in FIG. 5 includes a micro controller 51 that generates the alternating voltage and therefore the current flowing through the winding 11. By way of example, the micro-controller 51 may include an H-bridge. A second micro-controller 65 is included for start, stop and speed control. If a micro-controller 51 is used in place of the H-Bridge, the micro-controller 51 may also handle start, stop and speed control.

The current signal of the current flowing through the winding 11 is sensed at the H-Bridge micro-controller 51 and resistor 56, and further processed as shown in the signal diagrams in FIG. 5. The current signal is coupled to a first low pass filter LP1, which includes a resistor 52 and a capacitor 53. The current signal is also coupled to a second low pass filter LP2, which includes a resistor 54 and a capacitor 55. The values of the resistors 52 and 54 and the capacitors 53 and 55 are chosen in such a way that the cut-off frequency of the second low pass filter LP2 is around ten to twenty times higher than the cut-off frequency of the first low pass filter LP1. By way of example, the resistors 52 and 54 can be chosen as 82KΩ resistors, the capacitor 53 may be a 150 nF capacitor, and the capacitor 55 may be a 10 nF capacitor. It should be understood that the components of the two low pass filters will be chosen in such a way that the cut-off frequencies are in accordance with the rotational speed of the motor 41, the latter depending on the intended use of the motor 41. It should be understood that other values for the resistances and the capacitors could be used.

Additionally, a resistor 56 may be provided to stabilize the output signal of the H-Bridge μC 51 at a predetermined level. Additionally, a potentiometer 57 or variable resistor may be provided for adjusting an operating point of the system.

The output signals of the first low pass filter LP1 and the output signal of the second low pass filter LP2 are respectively used as input signals for the comparator 58. In the signal diagrams of FIG. 6, a plot of a first signal 61 shows the output of the low pass filter 43 at point LP 1, and a plot of a second signal 62 shows the output at point LP2. As can be seen from signals 61 and 62, the frequency components are attenuated in a different way. As the first signal 61 shows, the first low pass filter 43 attenuates the existing frequency components much more than the second low pass filter 44 as shown by second signal 62. As can further be seen from signal 61, the latter is nearly a straight line as a result of the low cut-off frequency. In the following, the course of the signal 62 will be explained in detail.

When the direction of the current through the winding 11 is changed, the magnetic forces of the permanent magnets 15a and 15b of the rotor 15 and the magnetic forces induced in the claws 13 and 14 of the stator rotate the rotor 15. As the rotor 15 starts to rotate, the magnetic flux of the motor system starts to change due to inductance, as the magnetic field changes. The current flowing through the winding 11 will then decrease, as the inductance counteracts the normal direction of current flow. The signal diagram of FIG. 6 shows that the current begins to decrease at location 62a. When the rotor 15 has finished a 90 degree turn, that is, when the rotor 15 has turned in such a way that the permanent magnets 15a and 15b and the claws 13 and 14 they face have a different polarity, the rotation will stop and the induction current will become zero, so that the current through the winding 11 will reach location 62b. When the turning of the motor 41 stops, the signal 62 starts to rise again, which increases the current flowing through the winding 11. When the magnetic poles of different polarity face each other, the polarity of the winding 11 is changed again. In the context of FIG. 5 this means that whenever signal 62 starts to rise again the system knows, that the direction of current has to be changed again. The system is configured in such a way that whenever the rising slope of signal 62 intersects signal 61, the system triggers a change in the polarity of the winding 11. As indicated by the arrows in the signal diagram in FIG. 6, the intersection of the two signals 61 and 62 is used as a trigger. The trigger is generated by the comparator 58 that compares the two signals 61 and 62. The output signal of the comparator 58 is fed to the clock input of a T flip flop 59 that acts as the converter 46 of FIG. 4. When a trailing edge is detected in the output signal of the comparator 58, the output signals of the flip-flop change from high to low and from low to high and vice versa. When the output signal of the flip-flop changes, the direction of the current flowing through the winding 11 is changed as can be seen by signal 64 in FIG. 6. At each trailing edge of the output signal of the comparator 58, shown by graph 63, the flip flop changes its state (graph 64). The two output signals of the flip-flop are connected to the micro controller 51, which changes the polarity of the alternating voltage and therefore, the direction of the current.

One of ordinary skill in the art will appreciate that the converter may take other forms. For example. the converter may also include a lookup table in which the output signals are stored in accordance with an input signal. Still further, the converter may include any suitable means for converting an input signal received from the comparator into the respective output signal to drive the control unit.

As can be seen from FIGS. 4-6, the use of a single winding 11 is enough to drive the motor 41 of the electric motor system of the invention. By analyzing the inductive behavior of the winding 11, and by processing the signal as shown in FIGS. 5 and 6, the position of the rotor 15 may be determined so that the direction of the current through the winding 11 may be changed at the precise moment in time to ensure a continuing rotation of the rotor 15.

Figure 7:
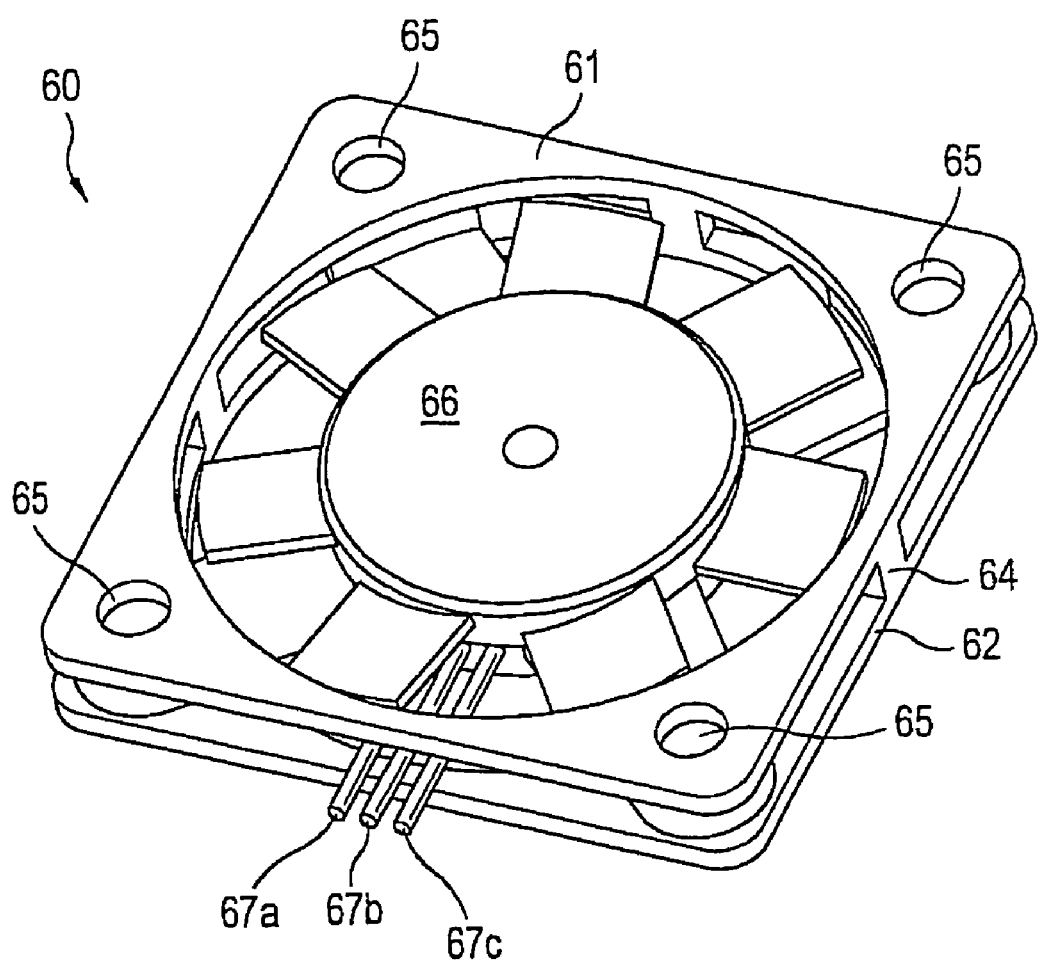
FIG. 7 illustrates a perspective view of a fan unit having an electric motor system according to one example of one implementation of the invention.

In FIG. 7, a fan unit 60 having an electric motor system according to one example of one implementation of the invention is shown. The fan unit 60 includes a front plate 61 and a back plate 62 for supporting an electric motor 66 as shown, for example, in FIG. 2, in a sandwich structure. The front plate 61 and the back plate 62 are connected via lateral webs 64 and by screws inserted into through holes 65 to form a housing for the electric motor 66. The electric motor 66 includes three connection pins 67a, 67b and 67c by which the device can be directly attached to a printed circuit board. In the example shown in FIG. 7c, the three connection pins 67a, 67b, 67c may serve for voltage supply, ground, and diagnostics, respectively. While FIG. 7 shows three connection pins 67a, 67b, 67c, those of ordinary skill in the art will understand that the structure may include more or fewer connection pins.

Further, while FIG. 7 shows the connection pins 67a, 67b and 67c extending from the center of the upper plate 61, it is possible to modify the structure of the fan unit 60 with regard to the position of the connection pins 67a, 67b and 67c to provide a modified structure optimized for the respective desired application. Preferably, the connection pins 67a, 67b and 67c are formed as male connectors of a plug-in connector with female connectors formed at the circuit board.

In the example shown in FIG. 7, the fan unit 60 may advantageously be directly attached to the printed circuit board via connection pins 67a, 67b, 67c by attaching the fan unit 60 to a printed circuit board (not shown in the example) and soldering the pins 67a, 67b and 67c to the printed circuit board, for example. This structure provides the particular advantage that it is not necessary to provide a further connector for electrical connection of the fan unit 60 to the circuit board. Thereby, the number of required components can be significantly reduced. Furthermore, the assembling time during assembling of a navigation system, for example, can be significantly shortened. There is no risk of failure due to a non-connected connector. The number of connection points is reduced as well.

Of course, the general concept of directly attaching a fan unit 60 to the printed circuit board via respective connection pins 67a, 67b and 67c may be utilized independently of the controlling method described above, that is, any fan motor known from the art may be used to be directly attached to the circuit board by use of respective connections pins as shown in the structure of FIG. 7, for example.

In conclusion, the present invention provides a simple electronic motor system, in which the behavior of the current flowing through the winding 11 can also be used for controlling the direction of the current flowing through the winding 11. A basic analysis of the signal with the use of two low pass filters, one comparator and one converting unit provides a straight forward control of the motor 41. The comparison of the two differently filtered signals provides sufficient information about the position of the rotor 15 relative to the stator. This eliminates the need for additional windings 11 and associated terminals allowing for a compact electronic motor system with a simple design and that can be manufactured in a cost effective way.

The foregoing description of an implementation has been presented for purposes of illustration and description. It is not exhaustive and does not limit the claimed inventions to the precise form disclosed. Modifications and variations are possible in light of the above description or may be acquired from practicing the invention. Note also that the implementation may vary between systems. The claims and their equivalents define the scope of the invention.

We claim:

1. An electric motor system comprising:
   a rotor having a plurality of permanent magnets;
   a stator having a winding through which current is flowing for driving the rotor;
   a control unit for detecting and controlling the current flowing through the winding;
   a first filter for filtering the current signal flowing through the winding, the first filter having a first filter output signal;
   a second filter for filtering the current flowing through the winding, the second filter having a second filter output signal;
   a comparator for comparing the first filter output signal with the second filter output signal;
   where the control unit controls the current flowing through the winding depending on the result of the comparison of the two filtered signals.

2. The electric motor system of claim 1 where the electric motor system is an electric motor ventilation system, where ventilation means are fixedly connected to the rotor.

3. The electric motor system of claim 1 where the control unit controls the direction of the current flowing through the winding in correspondence with the result of the comparison of the two filtered signals.

4. The electric motor system of claim 1 where the control unit includes a converting unit which controls the direction of the current flowing through the winding in correspondence with the result of the comparison of the two filtered signals.

5. The electric motor system of claim 3 where the control unit changes the direction of the current flowing through the winding when the signal from the second filter exceeds the signal form the first filter.

6. The electric motor system of claim 4 where the converting unit includes a flip flop that changes the direction of the current based on the signal received from the comparator.

7. The electric motor system of claim 4 where the converting unit includes a T flip flop that inverts its output signals for inverting the direction of the current when a trailing edge is detected on the output signal of the comparator.

8. The electric motor system of claim 1 where the first filter includes a low pass filter having a first cut-off frequency.

9. The electric motor system of claim 1 where the second filter includes a low pass filter having a second cut off frequency that is higher than the first cut-off frequency.

10. The electric motor system of claim 1 where the motor is a claw pole motor, the rotor having four circularly arranged permanent magnet poles where the permanent magnet poles have alternating poles in a circumferential direction, the stator having a first and second claw that are arranged on opposite sides of the stator.

11. The electric motor system of claim 1 further comprising a start unit for starting the motor, that includes a clock unit providing clock pulses for changing the direction of the current through the winding until the motor has reached a predetermined rotational speed.

12. The electric motor system of claim 1 further including pins for direct attachment to a printed circuit board.

13. A method for controlling an electric motor system with a rotor and a stator with a winding to which a voltage is supplied for driving the rotor, the method comprising the following steps:
  filtering the voltage with a first filter;
  filtering the voltage with a second filter;
  comparing the two filtered signal; and
  changing the direction of current flowing through the winding in correspondence with the result of the comparison.

14. The method of claim 13 where the two filtered signals are fed to a comparator that compares the two filtered signals and that transmits a result of the comparison to a converting unit that initiates the inversion of the direction of current flowing through the winding based on the result of the comparison.

15. A fan unit comprising:
  an electric motor system having a winding through which current is flowing for driving the electric motor system;
  a control unit for detecting and controlling the current flowing through the winding;
  a first filter for filtering the current signal flowing through the winding, the first filter having a first filter output signal;
  a second filter for filtering the current flowing through the winding, the second filter having a second filter output signal;
  a comparator for comparing the first filter output signal with the second filter output signal;
  where the control unit controls the current flowing through the winding depending on the result of the comparison of the two filtered signals.

16. The fan unit of claim 15 where the electric motor system further comprises pins for direct attachment to a printed circuit board.

* * * * *

UNITED STATES PATENT AND TRADEMARK OFFICE
CERTIFICATE OF CORRECTION

PATENT NO. : 7,439,698 B2  Page 1 of 1
APPLICATION NO. : 11/338428
DATED : October 21, 2008
INVENTOR(S) : Ludwig et al.

It is certified that error appears in the above-identified patent and that said Letters Patent is hereby corrected as shown below:

In the Field of the Invention:

Col. 1; Line 13, there should be a comma after "motors".

Col. 1; Line 14, there should be a comma after "particularly".

In the Background:

Col. 1; Line 23, after "and", the word --is-- should be inserted.

In the Detailed Description:

Col. 3; Line 31, "a" should be --an--.

Col. 5; Line 58, "7c" should be --7--.

In the Claims:

Col. 8; Claim 13, Line 7, "signal" should be --signals--.

Signed and Sealed this

Second Day of June, 2009

JOHN DOLL
*Acting Director of the United States Patent and Trademark Office*